(12) United States Patent
Dehos et al.

(10) Patent No.: US 8,592,969 B2
(45) Date of Patent: Nov. 26, 2013

(54) SEMICONDUCTOR DEVICE WITH PROTECTIVE SCREEN

(75) Inventors: Bruno Dehos, Grenoble (FR); Bruno Lagoguez, Saint Martin d'Uriage (FR)

(73) Assignee: STMicroelectronics (Grenoble) SAS, Grenoble (RE)

( * ) Notice: Subject to any disclaimer, the term of this patent is extended or adjusted under 35 U.S.C. 154(b) by 569 days.

(21) Appl. No.: 12/605,169

(22) Filed: Oct. 23, 2009

(65) Prior Publication Data

US 2010/0102439 A1 Apr. 29, 2010

(30) Foreign Application Priority Data

Oct. 29, 2008 (FR) ...................................... 08 57371

(51) Int. Cl.
*H01L 23/52* (2006.01)

(52) U.S. Cl.
USPC ..... 257/693; 257/690; 257/724; 257/E23.141

(58) Field of Classification Search
USPC ......................................... 257/659, 660, 693
See application file for complete search history.

(56) References Cited

U.S. PATENT DOCUMENTS

| 2004/0245640 A1 | 12/2004 | Tsukamoto et al. |
| 2004/0256717 A1 | 12/2004 | Suenaga et al. |
| 2005/0168960 A1 | 8/2005 | Asahi et al. |
| 2007/0182000 A1* | 8/2007 | Higashitani et al. .......... 257/723 |
| 2008/0007927 A1 | 1/2008 | Ito et al. |
| 2008/0157341 A1 | 7/2008 | Yang et al. |
| 2008/0303120 A1 | 12/2008 | Lee et al. |

FOREIGN PATENT DOCUMENTS

| EP | 1126522 A1 | 8/2001 |
| EP | 1657749 A2 | 5/2006 |
| FR | 2810495 A1 | 12/2001 |
| KR | 100835061 | 5/2008 |

OTHER PUBLICATIONS

French Search Report, FR 0857371, Jul. 14, 2009.

* cited by examiner

*Primary Examiner* — Jarrett Stark
*Assistant Examiner* — Lawrence Tynes, Jr.
(74) *Attorney, Agent, or Firm* — Coats & Bennett, PLLC

(57) ABSTRACT

A multi-layer substrate has a front face with external pads. An integrated-circuit chip is positioned inside of the multi-layer substrate. An electronic and/or electric component is also positioned inside of the substrate above the integrated-circuit chip. An electrical connection network is formed in the multi-layer substrate to selectively connect the integrated-circuit chip and component together and to the external pads. A first screen is positioned within the multi-layer substrate between the integrated-circuit chip and the electrical connection network, this first screen being connected by vias to the external pads. A second screen is position on a top (external) surface of the multi-layer substrate above the component and electrical connection network, this second screen being connected by vias to the external pads. The integrated-circuit chip is position to be inside the first and second screens.

13 Claims, 1 Drawing Sheet

SEMICONDUCTOR DEVICE WITH PROTECTIVE SCREEN

PRIORITY CLAIM

This application claims priority from French Application for Patent No. 08 57371 filed Oct. 29, 2008, the disclosure of which is hereby incorporated by reference.

TECHNICAL FIELD

The present invention relates to the field of semiconductor devices and more particularly to chips and electronic and/or electric components integrated into a substrate.

BACKGROUND

It has been possible to observe that the operation of certain chips and/or of certain components may be disrupted by external electromagnetic radiation. In addition, if certain chips and/or certain components process radiofrequency signals in particular, they also form sources of interference for the other chips or components integrated into one and the same substrate.

There is a need to enhance the protection of the semiconductor devices particularly against the effects of electromagnetic waves and consequently to improve the operation thereof.

There is also a need to integrate the production of such protection into the usual means of manufacturing the devices.

SUMMARY

According to an embodiment, a semiconductor device is proposed which comprises a substrate having a front face on which are formed external electrical connection pads, at least one integrated-circuit chip installed inside the substrate, at least one electronic and/or electric component installed inside the substrate behind the chip, the substrate comprising an electrical connection network selectively connecting the chip and the component together and/or to the electrical connection pads.

The semiconductor device may also comprise at least one screen comprising a portion substantially parallel to the transverse face and a plurality of electrical connection vias connecting this portion to a plurality of electrical connection pads on the transverse face, at least the chip being inside the screen.

The screen may be electrically insulated relative to the rest of the device.

The portion of the screen may comprise a board or layer.

The semiconductor device may comprise a first screen made of at least one electrically conductive material and comprising a portion extending between the chip and the component and a plurality of electrical connection vias connecting this portion to a first plurality of electrical connection pads, this plurality of vias being placed around the periphery of the chip; and a second screen made of at least one electrically conductive material and comprising a portion extending behind the component and a plurality of electrical connection vias connecting this portion to a second plurality of electrical connection pads, this second plurality of vias of the second screen being placed around and at a distance from the plurality of vias of the first screen.

The portion of the first screen may comprise a board or layer.

The electrical connection network may be formed between the first screen and the second screen and between the chip and the transverse face.

The second screen may be formed on the periphery of the substrate.

The portion of the first screen may comprise a board or layer.

The portion of the second screen may comprise a board or layer.

The portion of the second screen may be formed on a rear face of the substrate.

The first screen and the second screen may be electrically insulated relative to one another and relative to the rest of the device.

The substrate may be formed of layers of electrically non-conductive resin; the chip, the component and the electrical connection network being sunk or integrated into at least certain of the layers of resin.

According to an embodiment, an assembly is proposed which comprises a semiconductor device and a printed circuit board in which the external pads of the semiconductor device are connected to pads of the board by electrical connection balls, the first plurality of electrical connection pads and the second plurality of electrical connection pads of the semiconductor device being connected to a fixed potential of the printed circuit, in particular a ground reference.

In another example, an item of radiofrequency equipment is proposed comprising a semiconductor device and/or an assembly, in which the chip comprises a radiofrequency transmitter and/or receiver.

BRIEF DESCRIPTION OF THE DRAWINGS

A semiconductor device will now be described as a non-limiting example, illustrated by the drawing in which.

DETAILED DESCRIPTION OF THE DRAWINGS

Figure 1:
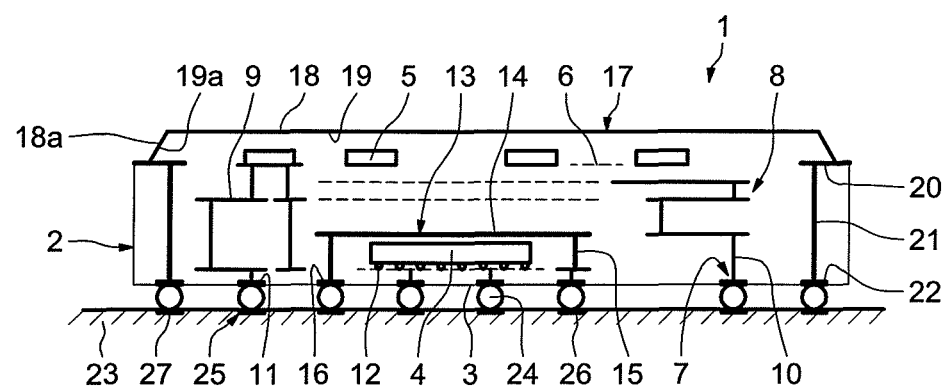
FIG. 1 represents a schematic section, perpendicular to the transverse face, of a semiconductor device.

The semiconductor device 1 shown, which is substantially parallelepipedal, comprises a multi-layer substrate 2 which has a transverse or front face 3, a chip 4 installed in the substrate 2 and placed parallel to and at a distance from the transverse face 3, and additional electronic and/or electric components 5 installed in the substrate 2 behind and at a distance from the chip 4 and placed beside one another and at a distance from the others on a level 6 parallel to the transverse face 3.

The transverse face 3 of the substrate 2 comprises a plurality of external transverse metal pads 7 for electrical connection, for example distributed in a matrix.

The substrate 2 comprises, on the inside, an electrical connection network 8 comprising electrical connection metal lines 9 parallel to the transverse face 3 and electrical connection metal vias 10 perpendicular to this transverse face, arranged on different levels and in different locations in order to selectively connect, depending upon the specific electrical connection requirements, the chip 4, the components 5 and certain pads 11 taken from the plurality of electrical connection pads 7. For this purpose, the chip 4 is furnished, on its face turned towards the transverse face 3, with metal electrical connection microbeads 12.

In an example of manufacture and in a manner known per se, the semiconductor device 1 may be obtained by successively producing, by deposition, various layers of an electrically nonconductive resin, on which the various electrical connection lines 9 are made by metal deposit and etching, and in which the electrical connection vias 10 are made in holes pierced by any known means, the chip 4 and the components 5 being sunk into the various layers of resin. The chip 4 may be placed at a short distance from the transverse face 3 of the device 1 and the components 5 may be placed in the rear layer of the device 1.

The semiconductor device 1 also comprises a first metal screen 13, or internal screen, which comprises a portion 14 formed by a metal board or layer, which extends parallel to the transverse face 3 and which passes between and at a distance from the chip 4 and the components 5, and which comprises a plurality of electrical connection metal vias 15, which are placed around and at a distance from the periphery of the chip 4, perpendicular to the transverse face 3. These vias 15 are connected on the one hand beneath the board 13 and on the other hand to a first series 16 of pads taken from the transverse pads 7.

Figure 2:
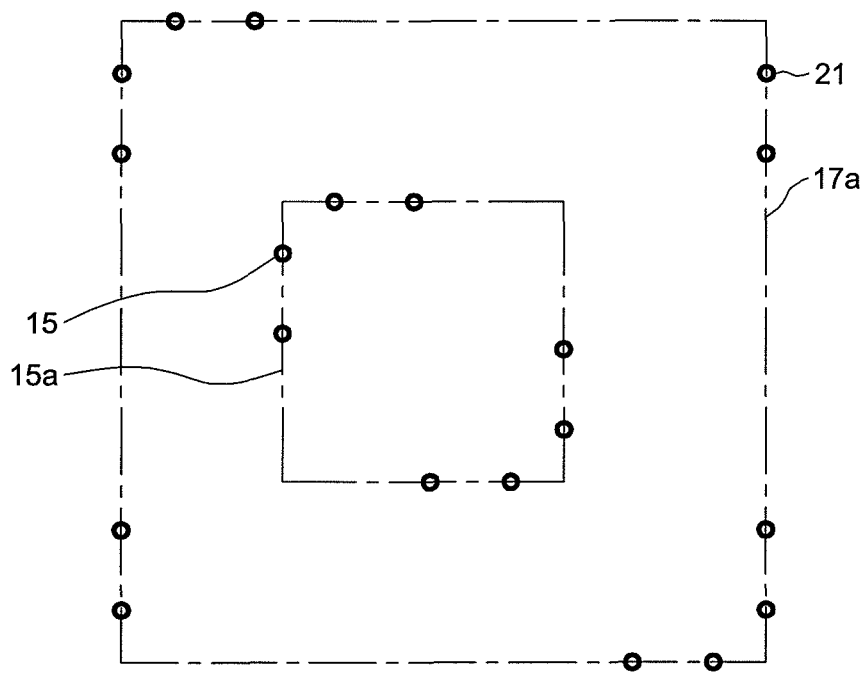
FIG. 2 represents a schematic section, parallel to the transverse face of the semiconductor device of FIG. 1.

For example, the board 14 covers at a distance the chip 4 and extends beyond the edges of the latter and, as shown in FIG. 2, the vias 15 may be distributed over a square 15a to form four walls, the first series 16 of pads also being distributed over a square.

The semiconductor device 1 also comprises a second metal screen 17, or external screen, which comprises a portion 18 formed by a metal layer formed on a rear surface 19 opposite to the front face 3 of the substrate 2 and extending via a peripheral portion 18a over inclined portions 19a of the sides of the substrate 2. This peripheral portion 18a is connected to a ring 20 partially integrated into the substrate 2. The second screen 17 also comprises a plurality of electrical connection metal vias 21 which are placed in the periphery of the substrate 2, around and at a distance from the plurality of vias 15 of the first screen 13 and perpendicular to the transverse face 3. These vias 21 are connected on the one hand beneath the ring 20 and on the other hand to a second series 22 of pads taken from the transverse pads 7.

For example, as shown in FIG. 2, the vias 22 may be distributed over a square 17a to form four walls, the second series 22 of pads also being distributed over a square and constituting the peripheral series of the matrix of pads 7.

The vias 15 and 21 may be respectively placed at equal distances, at very short distances. They may be respectively connected to the pads 16 and 22 directly or by auxiliary lines and vias arranged in the portion of the substrate 2 close to its transverse face 3.

It is advantageous that the electrical connection network 8 is formed between the first metal screen 13 and the second metal screen 17 and between the chip 4 and the transverse face 3 and that it has neither lines nor vias between the chip 4 and the board 14 and between the periphery of the chip 4 and at least a large proportion of the vias 15 from the board 14.

The board 14 and the vias 15 of the first screen 13, and the vias 21 and the ring 20 of the second screen 17 may be integrated into the manufacture described above, while the layer 18 of the second screen 17 may be obtained by a metal deposit on the rear face 19 and the portions 19a of the substrate 2, while joining the ring 20.

To carry out an assembly, the device 1 may mounted on a printed circuit board 23 by means of electrical connection balls 24 interposed between the pads of the matrix of pads 7 of the transverse face 3 and the pads 24 of a matrix of pads of the printed circuit board 23.

A first series of pads 26 taken from the pads of the matrix of pads 24, connected to the series of pads 16 of the first screen 13, and a second series of pads 27 taken from the pads of the matrix of pads 24, connected to the series of pads 22 of the second screen 17, are connected to a common potential, for example a ground potential of the printed circuit of the board 23.

In a variant, the electrical connection balls 24 may be dispensed with, the electrical connection pads 7 of the device 1 then being directly in contact with the pads 25 of the printed circuit board 23.

By its structure in the shape of a metal dish enveloping the chip 4, the first metal screen 13, electrically insulated from the rest of the device 1, forms a barrier or an electromagnetic protective cage, helping to insulate the chip 4 from the electromagnetic waves that may originate from the components 5 or from the outside of the device 1 and help to insulate the components 5 and the outside of the device 1 from the electromagnetic waves that may be emitted by the chip 4.

By its structure in the shape of a dish enveloping all of the other means integrated into the substrate 2, the second metal screen 17, electrically insulated from the rest of the device 1, forms a barrier or an electromagnetic protective cage, helping to insulate the chip 4 from the electromagnetic waves that may originate from outside the device 1, helping to insulate the outside of the device 1 from the electromagnetic waves which may be emitted by the chip 4, helping to insulate the components 5 from the electromagnetic waves that may originate from the outside of the device 1, and helping to insulate the outside of the device 1 from the electromagnetic waves that may be emitted by the components 5.

In a variant embodiment, several chips 4 may be installed in the substrate 2. The first screen 13 may then be placed so as to envelop all these chips.

As examples, the chip 4 may be an emitter, a radiofrequency receiver or transmitter, a power amplifier, a microprocessor. The additional components 5 may be passive components such as resistors, capacitors, filters, switches or memories.

According to one example, the device 1 and/or the assembly of this device 1 on the board 23 may be integrated into an item of radiofrequency equipment, the chip 4 being able to comprise a radiofrequency emitter and/or a receiver.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor device, comprising:
a substrate having a bottom face on which are formed a plurality of external electrical connection pads;
at least one integrated-circuit chip installed inside the substrate;
at least one electronic and/or electric component also installed inside the substrate at a position above the chip;
wherein the substrate comprises an electrical connection network selectively connecting the chip, the component and first ones of the electrical connection pads on the bottom face;
at least one screen comprising a portion substantially parallel to the bottom face and a plurality of electrical connection vias connecting this portion to second ones of the electrical connection pads on the bottom face;
wherein the chip is surrounded by the plurality of electrical connection vias of the screen;

wherein the at least one screen comprises:
a first screen made of an electrically conductive material and comprising a first portion extending between the chip and the component and a plurality of first electrical connection vias connecting this first portion to a first plurality of the second ones of the electrical connection pads, this plurality of first vias being placed around the periphery of the chip; and
a second screen made of electrically conductive material and comprising a second portion positioned above the component and a plurality of second electrical connection vias connecting this second portion to a second plurality of the second ones of the electrical connection pads, this plurality of second vias being placed around and at a distance from the plurality of first vias.

2. The device according to claim 1, wherein the first and second screens are electrically insulated relative to the chip, component and electrical connection network.

3. The device according to claim 1, wherein the portion of the at least one screen substantially parallel to the bottom face comprises one of a board or a layer.

4. The device according to claim 1, wherein the first portion of the first screen comprises a board or layer.

5. The device according to claim 1, wherein the electrical connection network comprises a first network formed between the first screen and the second screen and a second network formed between the chip and the bottom face.

6. The device according to claim 1, wherein the second screen is formed on the periphery of the substrate.

7. The device according to claim 1, wherein the second portion of the second screen comprises a board or layer.

8. The device according to claim 1, wherein the second portion of the second screen is formed on a top face of the substrate.

9. The device according to claim 1, wherein the first screen and the second screen are electrically insulated relative to one another.

10. The device according to claim 1, wherein the substrate is formed of layers of electrically nonconductive resin; and wherein the chip, the component and the electrical connection network are integrated into at least certain ones of the layers of resin.

11. The device according to claim 1 wherein the chip comprises one of a radio frequency transmitter and receiver circuit.

12. An assembly, comprising:
a semiconductor device comprising:
a substrate having a bottom face on which are formed a plurality of external electrical connection pads;
at least one integrated-circuit chip installed inside the substrate;
at least one electronic and/or electric component also installed inside the substrate at a position above the chip;
wherein the substrate comprises an electrical connection network selectively connecting the chip, the component and first ones of the electrical connection pads on the bottom face;
at least one screen comprising a portion substantially parallel to the bottom face and a plurality of electrical connection vias connecting this portion to second ones of the electrical connection pads on the bottom face;
wherein the chip is surrounded by the plurality of electrical connection vias of the screen;
wherein the at least one screen comprises:
a first screen made of an electrically conductive material and comprising a first portion extending between the chip and the component and a plurality of first electrical connection vias connecting this first portion to a first plurality of the second ones of the electrical connection pads, this plurality of first vias being placed around the periphery of the chip; and
a second screen made of electrically conductive material and comprising a second portion positioned above the component and a plurality of second electrical connection vias connecting this second portion to a second plurality of the second ones of the electrical connection pads, this plurality of second vias being placed around and at a distance from the plurality of first vias;
a printed circuit board wherein the external electrical connection pads of the semiconductor device are connected to pads of the printed circuit board by electrical connections; and
wherein the second ones of the electrical connection pads of the semiconductor device are connected to pads of the printed circuit board adapted for connection to a fixed ground potential.

13. The assembly according to claim 12 wherein the chip comprises one of a radio frequency transmitter and receiver circuit.

* * * * *